United States Patent
Eddins et al.

(10) Patent No.: US 10,381,833 B2
(45) Date of Patent: Aug. 13, 2019

(54) SOLID STATE POWER CONTACTOR

(71) Applicant: GE AVIATION SYSTEMS, LLC, Grand Rapids, MI (US)

(72) Inventors: Richard Anthony Eddins, Margate, FL (US); Kenneth Howard Schnorr, Palm Beach Gardens, FL (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 219 days.

(21) Appl. No.: 15/634,429

(22) Filed: Jun. 27, 2017

(65) Prior Publication Data

US 2018/0375327 A1    Dec. 27, 2018

(51) Int. Cl.
| | |
|---|---|
| H02J 3/14 | (2006.01) |
| B64D 41/00 | (2006.01) |
| H03K 17/687 | (2006.01) |
| H02J 1/00 | (2006.01) |
| H03K 17/10 | (2006.01) |
| H05K 1/00 | (2006.01) |

(52) U.S. Cl.
CPC ............... *H02J 3/14* (2013.01); *B64D 41/00* (2013.01); *H02J 1/00* (2013.01); *H03K 17/102* (2013.01); *H03K 17/687* (2013.01); *H05K 1/00* (2013.01); *B64D 2221/00* (2013.01); *H03K 2217/0009* (2013.01)

(58) Field of Classification Search
CPC ....... H02J 1/00; B64D 41/00; B64D 2221/00; H03K 17/102; H03K 17/687; H03K 2217/0009; H05K 1/00
USPC .......................................................... 307/9.1
See application file for complete search history.

(56) References Cited

U.S. PATENT DOCUMENTS

| | | | |
|---|---|---|---|
| 6,377,461 B1 | 4/2002 | Ozmat et al. | |
| 9,142,484 B2 * | 9/2015 | Delgado | ................. H01L 23/46 |
| 2007/0090464 A1 | 4/2007 | Delgado et al. | |

* cited by examiner

*Primary Examiner* — Carlos Amaya
(74) *Attorney, Agent, or Firm* — McGarry Bair PC (57) ABSTRACT

A power contactor can include a first conductive terminal, a second conductive terminal, a power overlay having a conductive backplane and solid state switches, and a controller module configured to selectively operate the solid state switches to enable conductive communication between the first conductive terminal and the second conductive terminal.

20 Claims, 5 Drawing Sheets

SOLID STATE POWER CONTACTOR

BACKGROUND OF THE INVENTION

Power systems, especially power systems in aircraft, manage the supplying of power from power sources, such as generators, to electrical loads. In aircraft, gas turbine engines are used for propulsion of the aircraft, and typically provide mechanical power which ultimately powers a number of different accessories such as generators, starter/generators, permanent magnet alternators (PMA), fuel pumps, and hydraulic pumps, e.g., equipment for functions needed on an aircraft other than propulsion. For example, contemporary aircraft need electrical power for avionics, motors, and other electric equipment. A generator coupled with a gas turbine engine will convert the mechanical power of the engine into electrical energy which is distributed throughout the aircraft by electrically coupled nodes of the power distribution system. The power distribution system can fail at any of the coupled nodes, which can interrupt the electrical power distribution, as well as any equipment reliant on that power.

BRIEF DESCRIPTION OF THE INVENTION

In one aspect, the present disclosure relates to a power contactor, including a first conductive terminal, a second conductive terminal, a flexible power overlay, further comprising a conductive backplane, a first solid state switch having a first source terminal connected with the conductive backplane and a first drain terminal connected with the first conductive terminal, and a second solid state switch having a second source terminal connected with the conductive backplane and a second drain terminal connected with the second conductive terminal. The power contactor further includes a controller module configured to selectively operate the first and second solid state switches to enable conductive communication between the first conductive terminal and the second conductive terminal. The power contactor form is adapted to be physically interchangeable with a conventional electro-mechanical contactor.

In another aspect, the present disclosure relates to a solid state power contactor for a power distribution system, including a first contactor terminal, a second contactor terminal, a flexible power overlay adapted to conform to the first contactor terminal and the second contactor terminal and supporting a set of solid state switches selectably connecting the first contactor terminal with the second contactor terminal, and a controller module configured to selectively operate the set of solid state switches to electrically connect the first contactor terminal with the second contactor terminal. The form of the power contactor is adapted to be spatially equivalent to or less than a conventional electro-mechanical contactor.

DESCRIPTION OF EMBODIMENTS OF THE INVENTION

The described aspects of the present disclosure are directed to an electrical power distribution system for an aircraft, which enables production and distribution of electrical power from a turbine engine, such as a gas turbine engine driven generator, to the electrical loads of the aircraft.

While "a set of" various elements will be described, it will be understood that "a set" can include any number of the respective elements, including only one element. As used herein, the terms "radial" or "radially" refer to a dimension extending between a center longitudinal axis of the power contactor, an outer engine circumference, or a circular or annular component of the power contactor or posts. The use of the terms "proximal" or "proximally," either by themselves or in conjunction with the terms "radial" or "radially," refers to moving in a direction toward the center post, or a component being relatively closer to the center post as compared to another component.

Also as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value. Additionally, while terms such as "voltage", "current", and "power" can be used herein, it will be evident to one skilled in the art that these terms can be interchangeable when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein.

The exemplary drawings are for purposes of illustration only and the dimensions, positions, order and relative sizes reflected in the drawings attached hereto can vary.

Figure 1:
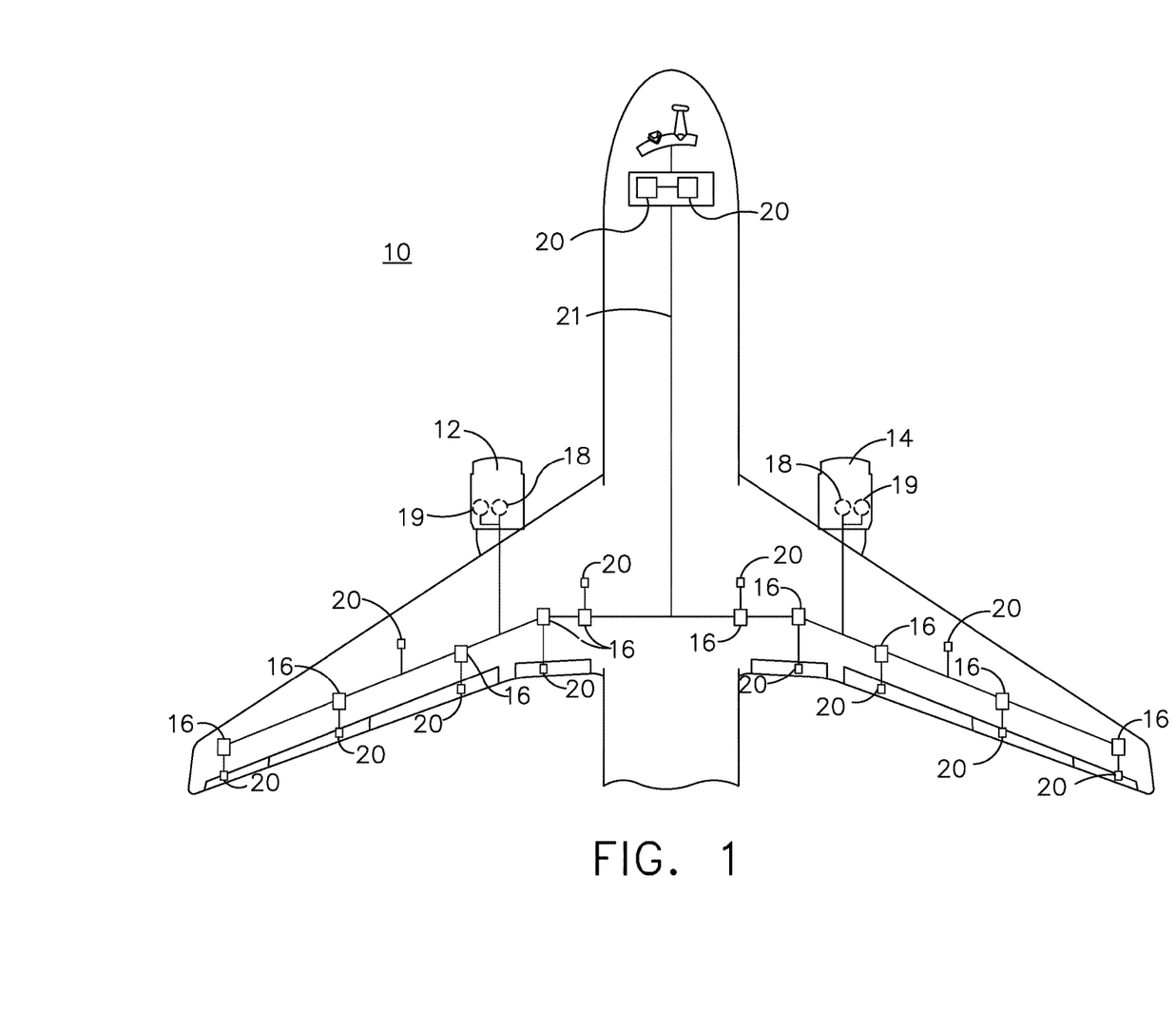
FIG. 1 is a top down schematic view of the aircraft and power distribution system in accordance with various aspects described herein.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as a first electric machine or a generator 18. The left and right engine systems 12, 14 can further include another power source, such as a second electric machine or generator 19. Non-limiting aspects of the disclosure can be included wherein, for example, the first generator 18 is a primary power source and the second generator is a secondary, back-up, or redundant power source. The aircraft is shown further having a set of power-consuming components, or electrical loads 20, such as for instance, an actuator load, flight critical loads, and non-flight critical loads.

The electrical loads 20 are electrically coupled with at least one of the generators 18, 19 via a power distribution system including, for instance, power transmission lines 21 or bus bars, and power distribution nodes 16. It will be understood that the illustrated aspects of the disclosure of FIG. 1 is only one non-limiting example of a power distribution system, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10, the operating left and right engine systems 12, 14 provide mechanical energy which can be extracted, typically via a spool, to provide a driving force for the set of generators 18, 19. The set of generators 18, 19, in turn, generate power, such as AC or DC power, and provides the generated power to the transmission lines 21, which delivers the power to the electrical loads 20, positioned throughout the aircraft 10. In one non-limiting aspect of the disclosure, at least one of the set of generators 18, 19 can include a variable frequency generator configured or selected to generate AC power.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. Additional management functions can be included. Furthermore, additional power sources for providing power to the electrical loads 20, such as emergency power sources, ram air turbine systems, generators, auxiliary power units (APUs), batteries, or the like, can be included, and can substitute for the power source.

Example power distribution management functions can include, but are not limited to, selectively enabling or disabling the delivery of power to particular electrical loads 20, by way of the operable connection, depending on, for example, available power distribution supply, criticality of electrical load 20 functionality, or aircraft mode of operation, such as take-off, cruise, or ground operations. During emergency or inadequate periods of electrical power generation, including but not limited to engine or generator failure, at least one additional power source can be operated, enabled, or connected for providing power to the electrical loads 20. Additional management functions can be included.

It will be understood that while aspects of the disclosure are shown in an aircraft environment of FIG. 1, the disclosure is not so limited and has general application to electrical power systems in non-aircraft applications, such as other mobile applications and non-mobile industrial, commercial, and residential applications. For example, while this description is directed toward a power system architecture in an aircraft, aspects of the disclosure can be further applicable to provide power, supplemental power, emergency power, essential power, or the like, in otherwise non-emergency operations, such as takeoff, landing, or cruise flight operations. It will be understood that the illustrated aspects of the disclosure are only one non-limiting example of an aircraft 10, and many other possible aspects and configurations in addition to that shown are contemplated by the present disclosure.

Furthermore, the number of, and placement of, the various components depicted in FIG. 1 are also non-limiting examples of aspects associated with the disclosure. For example, while various components have been illustrated with relative position of the aircraft (e.g. the electrical loads 20 on the wings of the aircraft 10, etc.), aspects of the disclosure are not so limited, and the components are not so limited based on their schematic depictions. Additional aircraft 10 configurations are envisioned.

It will be understood that while one aspect of the disclosure is shown in an aircraft environment, the disclosure is not so limited and has general application to electrical power systems in non-aircraft applications, such as other mobile applications and non-mobile industrial, commercial, and residential applications.

Figure 2:
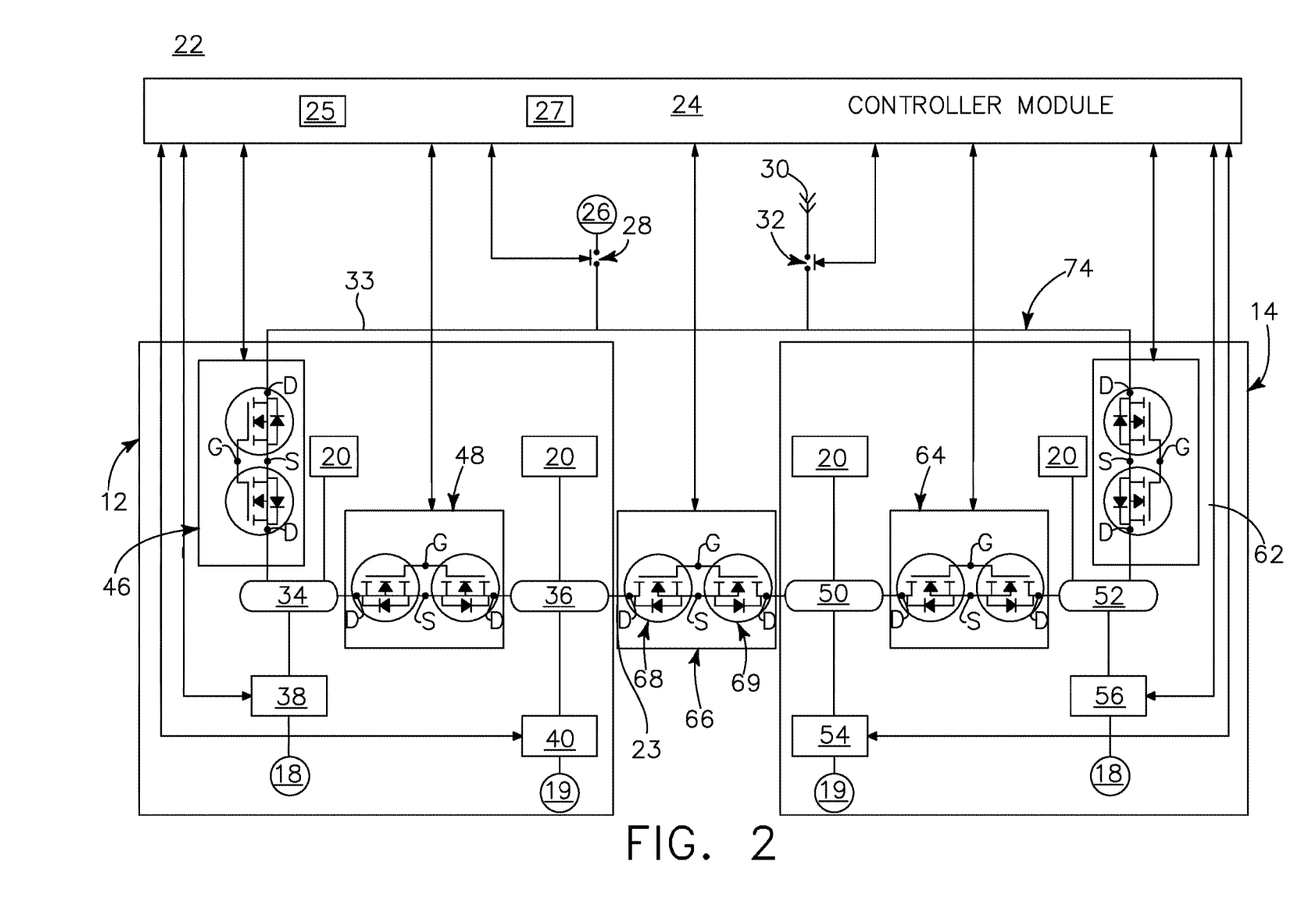
FIG. 2 is a schematic view of the power distribution in accordance with various aspects described herein.

FIG. 2 illustrates a schematic block diagram of a power distribution system 22 for an aircraft having multiple engine systems, such as the left engine system 12 and the right engine system 14 of FIG. 1. The left engine system 12 and the right engine system 14 can be connected by an electrical coupling 23. The power distribution 22 system is shown further including a controller module 24 having a processor 25 and memory 27, one or more non-engine power sources, shown as an auxiliary power unit (APU) 26 having an auxiliary power contactor (APC) 28 and an external ground power source 30 having an external power contactor (EPC) 32, and a tie bus 33 electrically connecting the left engine system 12, right engine system 14, APU 26, and external ground power source 30, in parallel. Each of the APC 28 and EPC 32 are configured to selectively couple or connect the respective APU 26 and external ground power source 30 to the tie bus 33. Additional power sources can be envisioned in addition to, or replacing one or more of the APU 26 and/or external ground power source 30. For instance, an emergency battery system, normal operation battery or battery bank system, fuel cell system, and/or ram air turbine system can be included in the power distribution system 22, and can be electrically coupled with the tie bus 33, in a parallel configuration.

The left engine system 12 is shown comprising a first power distribution bus 34, a second power distribution bus 36, a first integrated converter controller (ICC) 38, a second ICC 40, the first generator 18 capable of generating AC or DC power, and the second generator 19 capable of generating AC or DC power. The first power distribution bus 36 is connected, via electrical couplings, with at least one electrical load 20, the tie bus 33, the second power distribution bus 36, and the first ICC 38, which is further electrically coupled with the first generator 18. The second power distribution bus 34 is connected, via electrical couplings, with at least one electrical load 20 and the second ICC 40, which is further electrically coupled with the second generator 19. In the illustrated example, the set of generators 18, 19 can be adapted or configured to generate AC power, which can then be converted or rectified to DC power by the respective ICC 38, 40. In this sense, the set of power distribution buses 34, 36 can be DC power distribution buses. While a DC voltage system is described, aspects of the disclosure can be equally applicable to AC voltage systems, buses, generators, or the like. In one non-limiting aspect of the disclosure, the power distribution buses 34, 36 can be configured to provide, for instance 28 VDC, 270 VDC, 610 VDC, or any other higher or lower voltages.

The left engine system 12 can further comprise a first power contactor 46 positioned in-line on the electrical coupling connecting the first power distribution bus 34 with the tie bus 33, such that the first power contactor 46 is between the bus 34 and the non-engine power sources 26, 30, and a second power contactor 48 positioned in-line on the electrical coupling connecting the first power distribution bus 34 with the second power distribution bus 36.

The left and right engine systems 12, 14 can be substantially identical. Thus, the right engine system 14 is shown comprising a third power distribution bus 50, a fourth power distribution bus 52, a third integrated converter controller (ICC) 54, a fourth ICC 56, a third generator (shown similar to the second generator 19) capable of generating AC or DC power, and a fourth generator (shown similar to the first generator 18) capable of generating AC or DC power. The third power distribution bus 50 is connected, via electrical couplings, with at least one electrical load 20 and the third ICC 54, which is further electrically coupled with the third generator 19. The fourth power distribution bus 52 is connected, via electrical couplings, with at least one electrical load 20, the tie bus 33, the third power distribution bus 50, and the fourth ICC 56, which is further electrically coupled with the fourth generator 18. The operation of the right engine system 14 can be substantially similar to that of the left engine system 12, unless otherwise explained.

The right engine system 14 can further comprise a third power contactor 62 positioned in-line on the electrical coupling connecting the fourth power distribution bus 52 with the tie bus 33, such that the third power contactor 62 is between the bus 34 and the non-engine power sources 26, 30, and a fourth power contactor 64 positioned in-line on the electrical coupling connecting the third power distribution bus 50 with the fourth power distribution bus 52. Non-limiting aspects of the disclosure can further include a fifth power contactor 66 positioned in-line on the electrical coupling connecting the second power distribution bus 36 of the left engine system 12 with the third power distribution bus 50 of the right engine system 14. Thus, non-limiting aspects of the disclosure can be included wherein, for example, the combined configuration of the tie bus 33, the set of power contactors 46, 48, 62, 64, 66, and the power distribution buses 34, 36, 50, 52 defines a ring-type bus configuration 74. The illustrated power distribution system 22 is merely one non-limiting example of a power system or architecture including a set of power contactors. Additional or alternative configurations of the power distribution system 22 can employ or include aspects of the set of power contactors described herein.

As illustrated, non-limiting aspects of the set of power contactors 46, 48, 62, 64, 66 can be included wherein a set of solid state switches can be included to controllably connect, conduct, energize, transmit, or otherwise electrically couple the respective components together, in response to a control signal provided by the controller module 24 or the processor 25. For instance, in one non-limiting aspect illustrated, at least one of the set of power contactors 46, 48, 62, 64, 66 can include two power switches, shown as a first power switch 68 or metal-oxide-semiconductor field-effect transistor (MOSFET) and a second power switch 69 or MOSFET in a back-to-back configuration. In the illustrated example, the gate (G), source (S), drain (D) terminals are shown. Non-limiting examples of the first or second power switches 68, 69 can include, but are not limited to, silicon carbide or gallium nitride based MOSFETs, or the like, to allow for high power and high speed switching operations. In one non-limiting example, the first and second power switches 68, 69 can have a common gate (G) terminal, which can for example, be further connected with the controller module 24, and can further have a common source (S) terminal between the switches 68, 69.

The back-to-back configuration of the set of power switches 68, 69 provides each power contactor 46, 48, 62, 64, 66 a selectively energizable or conducting mode, and a selectively de-energized, or non-conducting mode. During the energized mode, the set of power switches 68, 69 are controlled such that the power contactor 46, 48, 62, 64, 66 allows for electrical coupling between the respective two power distribution buses (or any two components, as configured). During the de-energized mode, the first and second power switches 68, 69 are controlled such that the power contactors 46, 48, 62, 64, 66 prevent electrical coupling between, for example, the respective two power distribution buses.

Non-limiting aspects of the disclosure can be included wherein, for example, the controller module 24 of the power distribution system 22 is electrically or communicatively connected with each of the power contactors 46, 48, 62, 64, 66, each ICC 38, 40, 54, 56, the APC 28, and the EPC 32 such that the controller module 24 can be in bidirectional communication with, and capable of controlling, each of the aforementioned components. The controller module 24 can, for instance, independently control each of the aforementioned components or control a plurality of components as a group, as necessary.

While a left engine system 12 and a right engine system 14 are shown, alternative aspects are envisioned having more engine systems for the aircraft. Each engine system can be substantially identical to those illustrated, and can operate in substantially similar fashions. Additionally, while generators 18, 19 are described, it is envisioned that one or more generators 18, 19 can alternatively be replaced by a starter/generator, for providing left or right engine system 12, 14 starting functionality. Additionally, alternative aspects are envisioned wherein each engine system 12, 14 can have more or fewer generators, ICCs, power distribution buses, or the like.

During operation of the power distribution system 22, the running gas turbine engines of the left and right engine systems 12, 14 provide mechanical power used by each of the respective first and second generators 18, 19 to generate a power output. The power output of each generator can be, for instance, supplied to a respective ICC 38, 40, 54, 56, each of which is controlled by the controller module 24 to act as an AC to DC rectifier, provide a controlled DC power output, such as 270 VDC, to each respective power distribution bus 34, 36, 50, 52, which is used to power the electrical loads 20. AC aspects of the power distribution system 22 are likewise envisioned.

The power distribution buses 34, 36, 50, 52 can additionally supply power to, or receive power from another power distribution bus 34, 36, 50, 52 through the plurality of selective electrical coupling paths between each power distribution buses 34, 36, 50, 52. Each of the pluralities of electrical coupling paths between power distribution buses 34, 36, 50, 52 can be controlled by the controller module 24 selectively energizing or de-energizing each individual or plurality of power contactors 46, 48, 62, 64, 66, via a control signal, during normal bus switching operation. In this sense, the controller module 24 can be capable of controlling the power distribution system 22 to redirect power distribution.

Figure 3:
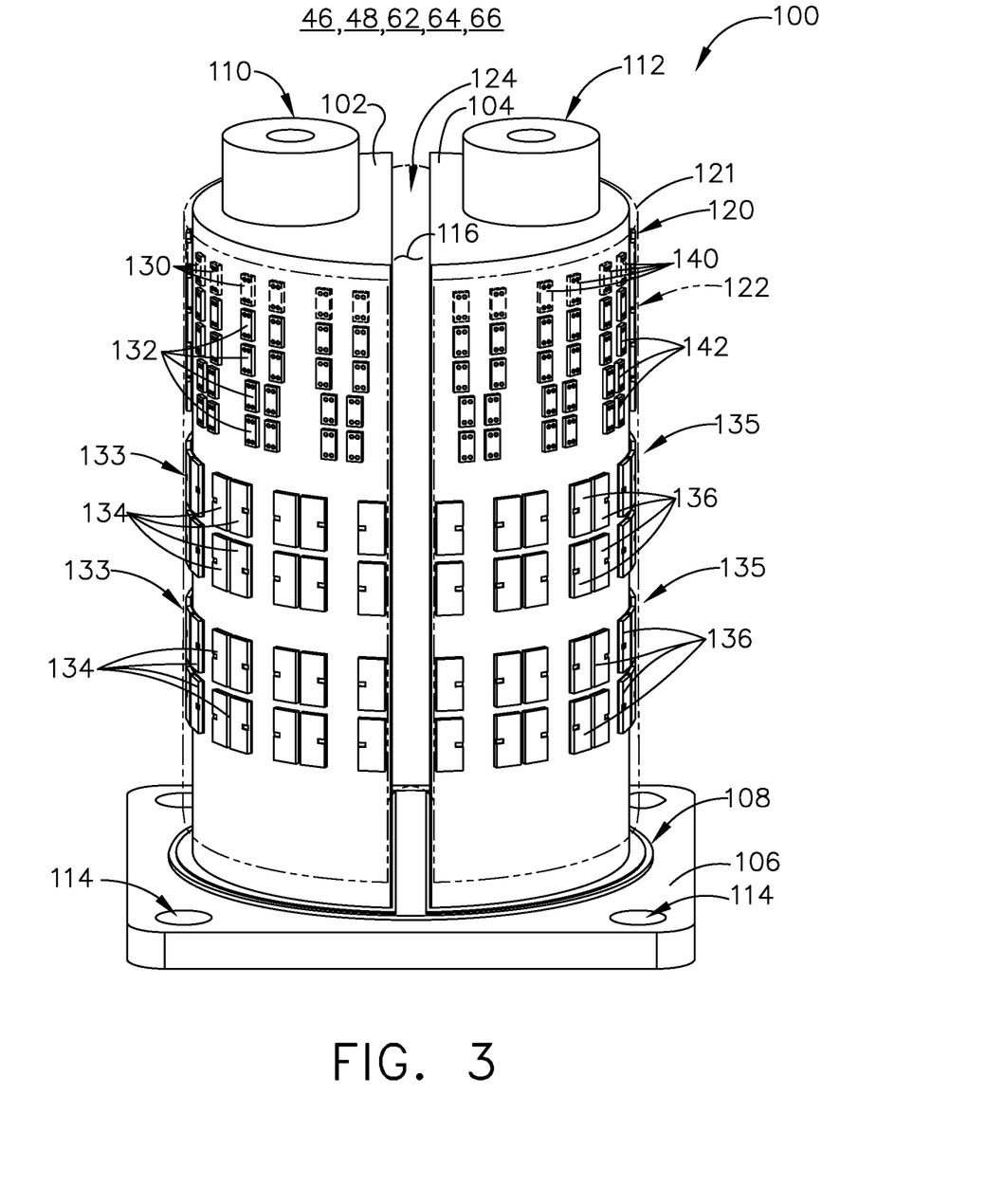
FIG. 3 is a schematic view of a solid state contactor and power overlay of the power distribution system of FIG. 2, in accordance with various aspects described herein.

FIG. 3 illustrates a schematic view of the power contactor 46, 48, 62, 64, 66 described herein. Non-limiting aspects of the power contactor 46, 48, 62, 64, 66 can be included wherein the power contactor 46, 48, 62, 64, 66 can include or incorporate a set of solid state devices to perform power switching operations, in a physical form of a physical contactor device. For example, the illustrated power contactor 46, 48, 62, 64, 66 is arranged or configured in the form 100 of an electro-mechanical contactor, yet includes solid-state switching components. In this sense, it is envisioned that a solid state power contactor 46, 48, 62, 64, 66 can be arranged in the electro-mechanical contactor form 100, and can thus be interchangeably placed, replaced, or otherwise installed, disposed, or the like, where an electro-mechanical contactor is accepted. The solid state power contact 46, 48, 62, 64, 66 can operate in substantially similar power connecting aspects, compared with the electro-mechanical contactor. However, solid state devices include a number of advantages over electro-mechanical contactors, which will be described below.

As shown, the solid state power contactor 46, 48, 62, 64, 66 can include a first semi-circular electrically conductive post 102 and a second semi-circular electrically conductive post 104, thermally mounted to a baseplate 106, for example, by way of a thermally conductive, but electrically insulative layer 108. Non-limiting aspects of the solid state power contactor 46, 48, 62, 64, 66 can include a configuration adapted for or enabling mounting of the solid state power contactor 46, 48, 62, 64, 66 with another mounting surface. For example, as shown, the baseplate 106 can include a set of mechanical fastener mounting holes 114 adapted to receive a mechanical fastener for mounting the solid state power contactor 46, 48, 62, 64, 66 to an aircraft, or the like. In one non-limiting example, the thermally conductive insulative layer 108 can include a ceramic, or the like.

In one non-limiting aspect, the set of semi-circular conductive posts 102, 104 can be arranged to be electrically isolated from each other, and with a "back" or flat side of each respective post 102, 104 facing the flat side of the other post 102, 104. The spacing between the respective posts 102, 104 can define a gap 116 between the posts 102, 104. The first conductive post 102 can include a first connection interface 110 configured, adapted, or the like, to electrically connect with a first terminal, such as a bus bar, power distribution bus, or the like. Similarly, the second conductive post 104 can include a second connection interface 112 configured, adapted, or the like, to electrically connect with a second terminal, such as a bus bar, power distribution bus, or the like. In this sense, the solid state power contactor 46, 48, 62, 64, 66 can selectively connect the first terminal with the second terminal.

The solid state power contactor 46, 48, 62, 64, 66 can also include a flexible power overlay 120 at least partially overlying a portion of the first conductive post 102 and the second conductive post 104. The flexible power overlay 120 can be flexible or semi-flexible in the sense that it can be at least partially bendable to match, corresponding with, align with, or the like, an underlying physical structure, or contours thereof. In the illustrated example, the flexible power overlay 120 can be configured or arrange to match the semi-circular or circular facets of at least one of the first or second conductive posts 102, 104.

Non-limiting aspects of the flexible power overlay 120 can include a flexible backplane 121 having a first surface, shown as an external surface 122, "external" being the surface opposite to, or radially facing outward from the first or second conductive posts 102, 104. The flexible backplane 120 can further include a second surface, shown as an internal surface 124, "internal" being the surface proximate to, or radially facing inward toward the first or second conductive posts 102, 104). In the illustrated example, the flexible backplane 121 is shown in phantom dotted line such that a set of electrical components disposed on the internal surface 124 of the flexible power overlay 120 can be viewed.

As shown, the internal surface 124 of the flexible power overlay 120 can include and support a number of electrical components, aligned with, or corresponding with the first or second conductive posts 102, 104. For example, the internal surface 124 of the flexible power overlay 120 can support electrical components aligned or overlying the first conductive post 102, including, but not limited to, a first set of gate terminals 130, a first set of gate resistors 132, a first switch 133, similar to the first power switch 68 and comprising a first set or array of MOSFETs 134, and the like. The first switch 133 can include the first set or array of MOSFETs 134 radially configured in parallel such that the outer surface (relative to the post 102) of the first set of MOSFETs 134 are source terminals that are conductively associated or connected with the flexible backplane 121, and such that the inner surface (proximate to the post 102) of the first set of MOSFETs 134 are drain terminals that are conductively contacting the first conductive post 102. As described herein, at least a continuous portion of the flexible backplane 121 can be a conductive portion. In this sense, at least one of the external surface 122, the internal surface 124, or a layer therebetween, can be electrically conductive.

In another example, the internal surface 124 of the flexible power overlay 120 can support electrical components aligned or overlying the second conductive post 104, including, but not limited to, a second set of gate terminals 140, a second set of gate resistors 142, a second switch 135, similar to the second power switch 69 and comprising a second set or array of MOSFETs 136—and the like. The second switch 135 can include the second set or array of MOSFETs 136 radially configured in parallel such that the outer surface (relative to the post 104) of the second set of MOSTFETs 136 are source terminals that are conductively connected with the flexible backplane 121, and such that the inner surface (proximate to the post 104) of the second set of MOSFETs 136 are drain terminals that are conductively contacting the second conductive post 104.

Non-limiting aspects of the disclosure can be included wherein the flexible power overlay 120 is arranged or connected with the power contactor 46, 48, 62, 64, 66 such that the sets of MOSFETs 134, 136 are consistently or reliably in conductive contact with the respective conductive post 102, 104. In this sense, the flexible power overlay 120 can be connected with the power contactor 46, 48, 62, 64, 66 by any connecting or fastening mechanism, including but not limited to solder, adhesive, mechanical straps, mechanical fasteners, the like, or a combination thereof. Additionally, non-limiting aspects of the flexible power overlay 120 can be included wherein the flexible power overlay 120 overlays only a portion of the conductive posts 102, 104.

The sets of gate terminals 130, 140 can be communicatively or conductively connected with the controller module 24 or processor 25 and can, for example, in combination with the respective sets of gate resistors 132, 142, and in response to instruction or control signals from the controller module 24 or processor 25, selectively conduct current or power between the flexible backplane and the conductive posts 102, 104. In this sense, when controllably operated to conduct current, the sets of MOSFETs 134, 136 operate as closed switches to, for instances, conduct power received at the first interface 110, through the first conductive post 102, through the inner surfaces of the first set of MOSFETs 134 to the conductive portion of the flexible backplane 121 at the outer surfaces of the first set of MOSFETs 134. The flexible backplane 121 further conducts the power around at least a circumference of the solid state power contactor 46, 48, 62, 64, 66 to the outer surfaces of the second set of MOSFETs 136 to the second conductive post 104 via the inner surfaces of the second set of MOSFETs 136 (e.g. the drain terminal), wherein it can be conducted through the second conductive post 104 to the second interface 112. In this sense, the solid state power contactor 46, 48, 62, 64, 66 can operate effectively like an electro-mechanical contactor.

Figure 4:
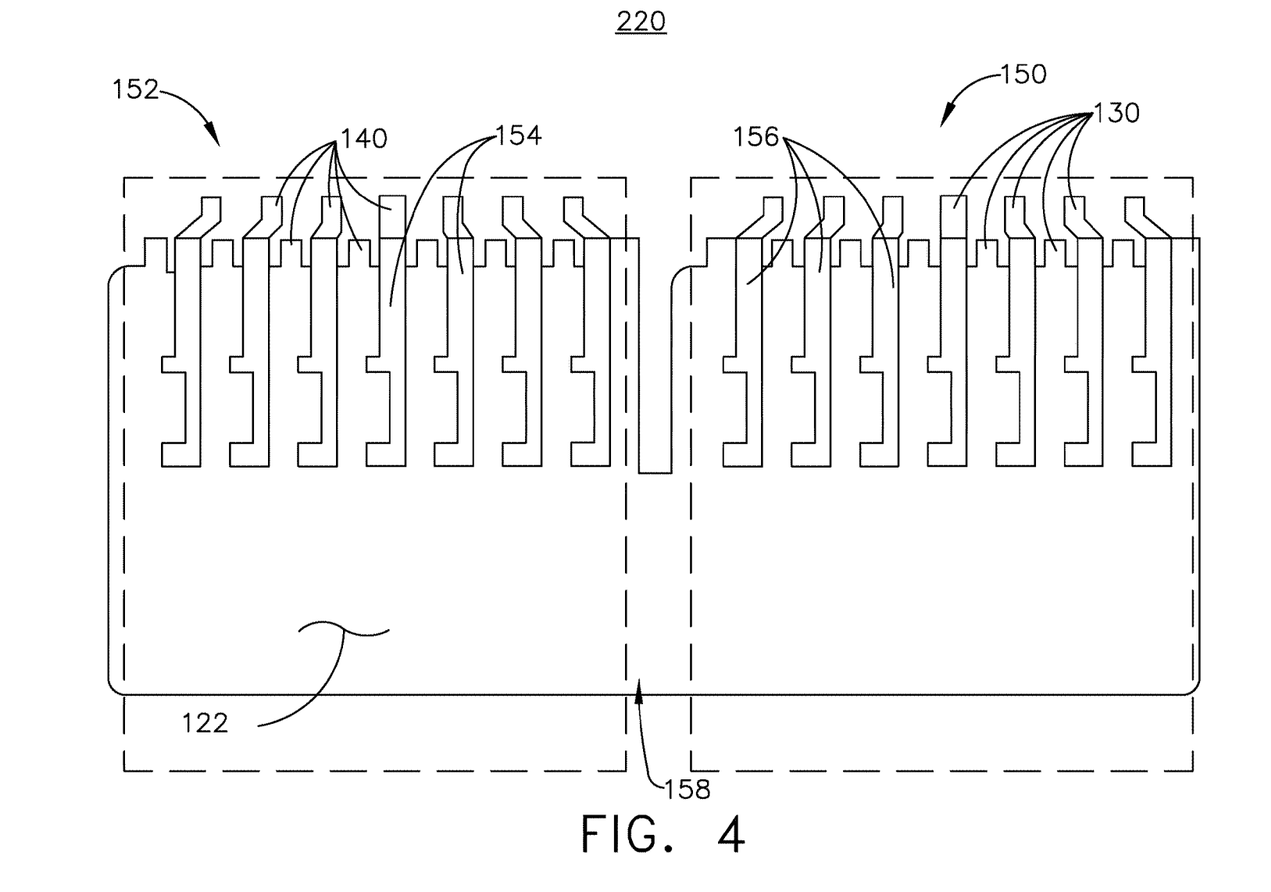
FIG. 4 is a view of a first surface of the power overlay of FIG. 3, in accordance with various aspects described herein.

FIG. 4 illustrates a perspective view of another non-limiting example of the flexible power overlay 220 of FIG. 3 in a substantially flat arrangement to clearly show aspects of the device. As shown, aspects of the flexible power overlay 220 can include a substantially planar structure that is flexible to match the underlying physical structure, as shown in FIG. 3. For example, as shown, a first portion 150 of the flexible power overlay 220 and the first set of MOSFETs 134 can be arranged to overlay the first conductive post 102. Likewise, a second portion 152 of the flexible power overlay 220 and the second set of MOSFETs 136 can be arranged to overlay the second conductive post 104. The first portion 150 and the second portion 152 can include a connecting "bridge" portion 158, which can further conductively connect the first portion 150 with the second portion 152. FIG. 4 also further illustrates the external surface 122, as described herein, the respective sets of gate and source terminals 130, 140, and a non-limiting example arrangement or configuration of conductive leads or traces 154, 156 corresponding with the respective first and second portions 150, 152.

Figure 5:
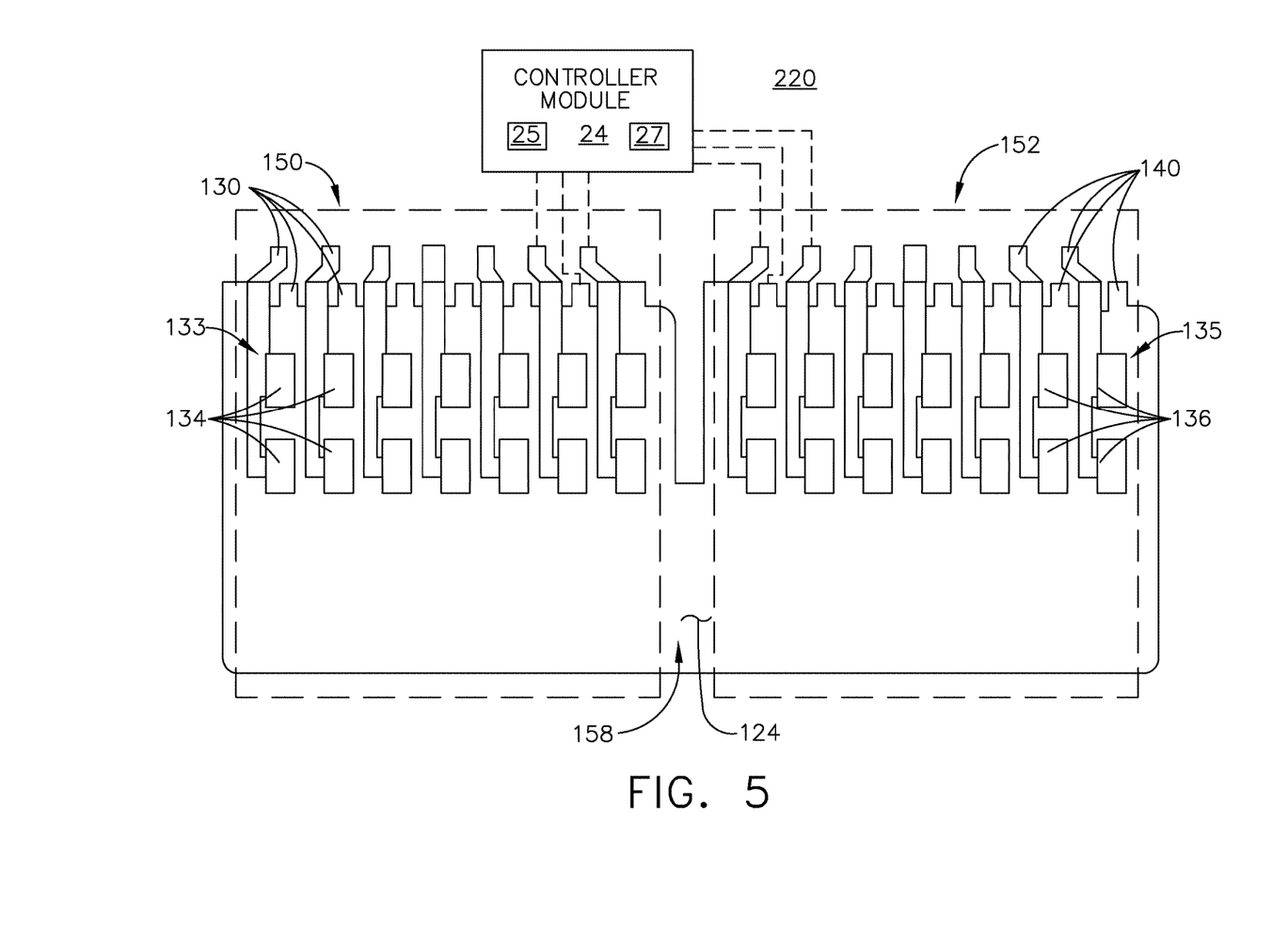
FIG. 5 is a view of a second surface of the power overlay of FIG. 3, in accordance with various aspects described herein.

FIG. 5 illustrates a perspective view of the opposite surface of the non-limiting example of the flexible power overlay 220 of FIG. 4. As shown, the flexible power overlay 220 internal surface 124 supports the sets of MOSFETs 134, 136, as well as the sets of gate resistors 132, 142 (not shown), the sets of gate terminals 130, 140 (shown schematically connected with the respective MOSFETs 134, 136), and the like, corresponding to the first and second portions 150, 152. While FIG. 5 illustrates the sets of MOSFETs 134, 136 schematically connected with the sets of gate terminals 130, 140, non-limiting aspects of the disclosure can be included wherein the electrical interconnects (for example, except the drain terminal of the sets of MOSFETs 134, 136), are connected by way of the external surface 122, or for example, by way of a conductive connections within a multi-level flexible power overlay 120, 220. FIG. 5 also schematically illustrates the communicative or conductive connection of the respective gate terminals 130, 140 with the controller module 24 or processor 25.

Many other possible aspects and configurations in addition to that shown in the above figures are contemplated by the present disclosure. For example, configurations of the solid state power contactor can be included wherein at least one of the base, conductive posts, or power overlays are configured or arranged to match or correspond with another physical electro-mechanical contactor form, such that the described solid state power contactor can be interchangeably installed in place of, or in the same physical space that would otherwise occupy the electro-mechanical contactor form. Additionally, aspects of the disclosure can be included wherein, for example, the number of MOSFETs 134, 136 included, or the configuration of the flexible power overlay 120, 220 can be based at least partially on an expected power rating for the solid state power contactor 46, 48, 62, 64, 66. For example, higher power ratings can include additional MOSFETs 134, 136 for current sharing purposes. Additionally, heat generated by the MOSFETs 134, 136 during operation can be removed or thermally conducted away from the MOSFETs 134, 136 by way of the conductive posts 102, 104, and via the respective interfaces 110, 112, or through the thermally conductive insulative layer 108 to the baseplate 106. In yet another aspect, the gap 116 can be filled or occupied with control circuitry, the controller module 24, or the like, or with a dielectric insulator.

The aspects disclosed herein provide a power distribution system having solid state power contactors. The technical effect is that the above described aspects enable the bidirectional switching of the power distribution system with the benefits of solid state devices. Conventional electro-mechanical contactors have a limited life when required to physically connect and disconnect physical couplings in circuits with high current loads, high voltages (e.g. 270 Volts, direct current), or a combination thereof. Failures of conventional electro-mechanical contactors can include contacts that become welded closed by way of electrical arcing, reducing the overall reliability of the power distribution system.

One advantage that can be realized in the above described aspects of the disclosure is that the above described aspects have superior conductive properties and switching operations associated with solid state devices. For example, solid state devices can be flexibly associated, aligned, formed, or fit into any number of spatial or geometric configurations, allowing them to essentially take the form of the contactor desired. This allows for the creation and implementation of a set of solid state contactors that can be installed or electrically interchangeable in the same form as existing or conventional electro-mechanical designs on legacy aircraft, and operating in an effectively similar fashion. Thus, the above described aspects can include a solid state power contactor in substantially the same or smaller physical form (e.g. shape, configuration, arrangement, contours, dimensions, or the like) of conventional electro-mechanical power contactors. Additionally, by way of the controller module, aspects of the solid state contactors can effectively operate with controllable "soft-start", programmable current limits, or the like, such that the solid state power contactor can control or reduce high inrush currents. Furthermore, aspects of the disclosure can be likewise applied in alternating current or direct current power system configurations.

Another advantage that can be realized in the above described aspects is that the plurality of selectable power distribution paths provides a robust power distribution system with improved immunity from one or more electrical faults, reducing the likelihood of partial or total aircraft electrical failure. Yet another advantage of the above described aspects is that the operation of coupling and decoupling the DC power distribution buses by solid state devices provide for increased reliability because of the lack of mechanical componentry, and thus, reduces the likelihood of mechanical failure in the power distribution system. Even yet another advantage of the above described aspects is that the disclosure provides a power distribution system with high speed switching that provides detection of faults, and alternate routing or clearing of the said faults.

When designing aircraft components, important factors to address are size, weight, and reliability. The above described power distribution system has a decreased number of parts as the system will be able to provide regulated power distribution, making the complete system inherently more reliable. This results in a lower weight, smaller sized, increased performance, and increased reliability system. The lower number of parts and reduced maintenance will lead to a lower product costs and lower operating costs. Reduced weight and size correlate to competitive advantages during flight.

To the extent not already described, the different features and structures of the various aspects can be used in combination with each other as desired. That one feature is not illustrated in all of the aspects is not meant to be construed that it is not included, but is done for brevity of description. Thus, the various features of the different aspects can be mixed and matched as desired to form new aspects of the disclosure, whether or not the new aspects are expressly described. All combinations or permutations of features described herein are covered by this disclosure.

This written description uses examples to disclose aspects of the disclosure, including the best mode, and also to enable any person skilled in the art to practice the aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power contactor, comprising:
    a first conductive terminal;
    a second conductive terminal;
    a flexible power overlay, comprising:
        a conductive backplane;
        a first solid state switch having a first source terminal connected with the conductive backplane and a first drain terminal connected with the first conductive terminal; and
        a second solid state switch having a second source terminal connected with the conductive backplane and a second drain terminal connected with the second conductive terminal; and
    a controller module configured to selectively operate the first and second solid state switches to enable conductive communication between the first conductive terminal and the second conductive terminal;
    wherein the power contactor form is adapted to be physically interchangeable with a conventional electro-mechanical contactor.

2. The power contactor of claim 1 wherein the first conductive terminal is connected with a first power distribution bus and the second conductive terminal is connected with a second power distribution bus.

3. The power contactor of claim 1 wherein at least one of the first or second conductive terminals is a semi-circular post.

4. The power contactor of claim 3 wherein the flexible power overlay is a substantially planar structure.

5. The power contactor of claim 4 wherein the flexible power overly has a first surface and a second opposing surface.

6. The power contactor of claim 5 wherein the first surface abuts the first and second solid state switches.

7. The power contactor of claim 6 wherein the flexible power overlay is wrapped about at least an outer surface portion of the first conductive terminal and at least an outer surface portion of the second conductive terminal.

8. The power contactor of claim 3 wherein the first and second conductive terminals are semi-circular posts each having at least one flat surface, and the first and second semi-circular posts are arranged with the respective flat surfaces proximate to one another.

9. The power contactor of claim 8 wherein the first and second semi-circular posts are spaced by a gap.

10. The power contactor of claim 9 wherein the controller module is disposed within the gap.

11. The power contactor of claim 1 wherein at least one of the first or second solid state switch includes a set of solid state switches.

12. The power contactor of claim 11 wherein the number of solid state switches in the set of solid state switches is related to at least one of a desired voltage rating or a desired power rating for the power contactor.

13. The power contactor of claim 11 wherein the set of solid state switches are electrically arranged in parallel.

14. The power contactor of claim 1, further comprising a thermally conductive baseplate and wherein the first and second conductive terminals are supported by the baseplate.

15. The power contactor of claim 14, further comprising a thermally conductive and electrically insulating layer disposed between the first and second conductive terminals and the baseplate.

16. The power contactor of claim 1 wherein the flexible power overlay is adapted to match the contours of at least one of the first or second conductive terminals.

17. A solid state power contactor for a power distribution system, comprising
    a first contactor terminal;
    a second contactor terminal;
    a flexible power overlay adapted to conform to the first contactor terminal and the second contactor terminal and supporting a set of solid state switches selectably connecting the first contactor terminal with the second contactor terminal; and
    a controller module configured to selectively operate the set of solid state switches to electrically connect the first contactor terminal with the second contactor terminal;
    wherein the form of the power contactor is adapted to be spatially equivalent to or less than a conventional electro-mechanical contactor.

18. The solid state power contactor of claim 17 wherein the set of solid state switches includes a first set of solid state switches conductively associated with the first contactor terminal and a second set of solid state switches conductive associated with the second contactor terminal.

19. The solid state power contactor of claim 17 wherein the solid state contactor is physically interchangeable with the conventional electro-mechanical contactor.

20. The solid state power contactor of claim 17 wherein the solid state power contactor is electrically interchangeable with the conventional electro-mechanical contactor of a legacy aircraft.

* * * * *